ns Patent [19]

United States Patent [19]
Shoji et al.

[11] Patent Number: 5,315,547
[45] Date of Patent: May 24, 1994

[54] NONVOLATILE SEMICONDUCTOR MEMORY DEVICE WITH SELECTIVE TOW ERASURE

[75] Inventors: Kazuyoshi Shoji, Tokyo; Tadashi Muto, Iruma; Yasurou Kubota, Tokyo; Koichi Seki, Tokyo; Kazuto Izawa, Tokyo; Shinji Nabetani, deceased, Tokyo, Japan, by Yuko Nabetani, administratrix

[73] Assignees: Hitachi, Ltd.; Hitachi VLSI Engineering Corp., both of Tokyo, Japan

[21] Appl. No.: 960,280

[22] Filed: Oct. 13, 1992

Related U.S. Application Data

[63] Continuation of Ser. No. 713,026, Jun. 7, 1991, abandoned, which is a continuation of Ser. No. 376,667, Jul. 7, 1989, abandoned.

[30] Foreign Application Priority Data

Jul. 11, 1988 [JP] Japan ................................ 63-172230

[51] Int. Cl.$^5$ .............................................. G11C 7/00
[52] U.S. Cl. ..................................... 365/185; 365/218; 365/230.03; 365/230.08; 365/900; 257/315
[58] Field of Search ................... 365/230.03, 218, 185, 365/900, 230.08; 357/93.5, 317

[56]  References Cited

U.S. PATENT DOCUMENTS

| 4,203,158 | 5/1980 | Frohman-Bemtchkowsky et al. | 365/185 |
|---|---|---|---|
| 4,247,918 | 1/1981 | Iwahashi et al. | 365/185 |
| 4,279,024 | 7/1981 | Schrenk | 365/185 |
| 4,357,685 | 11/1982 | Daniele et al. | 365/185 |
| 4,460,982 | 7/1984 | Gee et al. | 365/218 |
| 4,527,257 | 7/1985 | Cricchi | 365/218 |
| 4,527,258 | 7/1985 | Guterman | 365/185 |
| 4,599,707 | 7/1986 | Fang | 365/185 |
| 4,611,309 | 9/1986 | Chuang et al. | 365/185 |
| 4,683,554 | 7/1987 | Lockwood et al. | 357/23.5 |
| 4,691,216 | 9/1987 | Terada et al. | 365/185 |
| 4,691,298 | 9/1987 | Fukuda et al. | 365/230.03 |
| 4,698,787 | 10/1987 | Mukherjee et al. | 365/185 |
| 4,766,473 | 8/1988 | Kuo | 365/185 |
| 4,797,856 | 1/1989 | Lee et al. | 365/218 |
| 4,829,482 | 5/1989 | Owen | 365/185 |
| 4,878,203 | 10/1989 | Arkawa | 365/185 |
| 4,931,997 | 6/1990 | Mitsuishi et al. | 365/218 |
| 4,949,309 | 8/1990 | Rao | 365/900 |
| 5,097,446 | 3/1992 | Shoji et al. | 365/900 |

OTHER PUBLICATIONS

B. Rössler, "Elect. Eras. and Reprog. ROM Using N--Chan Simos One-Trans. Cell," IEEE Trans. on Elec. Dev., vol. ED-24 #5, May 1977, pp. 606-610.

V. K. Ynett et al., "An In-System Reprogrammable 256K CMOS Flash Mem," ISSCC, Feb. 18, 1988, vol. 132, 133.

*Primary Examiner*—Joseph E. Clawson, Jr.
*Attorney, Agent, or Firm*—Antonelli, Terry, Stout & Kraus

[57]  ABSTRACT

In a nonvolatile semiconductor memory device, a high voltage is selectively exerted between a word line to which the control gates of nonvolatile semiconductor memory elements are coupled and a source line to which the sources of the nonvolatile semiconductor memory elements are coupled, whereby charges stored in the floating gates are extracted through the source line. In addition, the nonvolatile semiconductor memory elements to be erased are provided with a source potential having ramp-rate characteristics such that the sources are gradually raised from a low voltage to the high voltage. Thus, the erasure of a predetermined part of the memory array of the memory device becomes possible in accordance with the division of the source lines or that of the word lines, and an excessive intense electric field can be prevented from acting between the floating gates and the sources because a ramp rate is used for the erasing high voltage.

7 Claims, 5 Drawing Sheets

NONVOLATILE SEMICONDUCTOR MEMORY DEVICE WITH SELECTIVE TOW ERASURE

This application is a continuation of application Ser. No. 713,026, filed on Jun. 7, 1991; which was a continuation of Ser. No. 376,667 filed on Jul. 7, 1989 both abandoned.

BACKGROUND OF THE INVENTION

The present invention relates to a nonvolatile semiconductor memory device. More particularly, it relates to techniques which are effective when utilized for, e. g., an electrically rewritable nonvolatile memory device of one-element/bit construction that has floating gate type nonvolatile memory elements.

A floating gate type nonvolatile memory device of one-element/bit construction, in which one bit (one memory cell) is constructed of a single nonvolatile memory element of the floating gate type and which is rewritable, is discussed in, for example, "ISSCC 88 Digest of Technical Papers", pp. 132-133. An erasing method for the floating gate type nonvolatile memory device is also discussed in the literature, and it consists in that, as in an EPROM (erasable and programmable read only memory), a high voltage is applied to a source line common to all bits, thereby to collectively erase all the bits. As the erasing high voltage, an external supply voltage is directly applied through a switch MOSFET (insulated-gate field effect transistor) or the like.

SUMMARY OF THE INVENTION

In the floating gate type nonvolatile memory device stated above, the source line is common to all the bits. This leads to the problem that the erase mode of the device is a single mode of collective erasure in which all data items are collectively erased, so partial erasure is impossible. Moreover, in the erase operation, the external supply voltage is directly applied to the source line through the switch MOSFET. In this regard, the inventor's study has revealed that the potential of the source line rises abruptly, and that immediately after the rise, a high electric field acts between the floating gate and the source of each nonvolatile semiconductor memory element. As a result, an insulator film etc. lying between the floating gate and the source might be deteriorated or destroyed under the action of the high electric field, to incur the problem that a serious bad influence is exerted on the reliability of the information holding operation of the device.

An object of the present invention is to provide a nonvolatile semiconductor memory device which permits part of a memory array to be erased.

Another object of the present invention is to provide a nonvolatile semiconductor memory device whose reliability is prevented from lowering due to an erase operation.

The above and other objects and novel features of the present invention will become apparent from the description of this specification when read in conjunction with the accompanying drawings.

Typical aspects of performance of the present invention are briefly summarized as follows: A high voltage is selectively exerted between a word line to which the control gates of nonvolatile semiconductor memory elements are coupled and a source line to which the sources of the nonvolatile semiconductor memory elements are coupled, whereby charges stored in the floating gates are extracted to the source line side. Besides, the nonvolatile semiconductor memory elements to be erased are endowed with the ramp-rate characteristics that the potential of the source line to which the sources of the memory elements are coupled is gradually raised from a low voltage to the high voltage.

According to the expedients described above, the partial erasure of a memory array becomes possible in accordance with the division of the source line or that of the word line, and an excessive intense electric field can be prevented from acting between the floating gates and the sources because a ramp rate is bestowed on the erasing high voltage.

DESCRIPTION OF THE PREFERRED EMBODIMENTS

Figure 1:
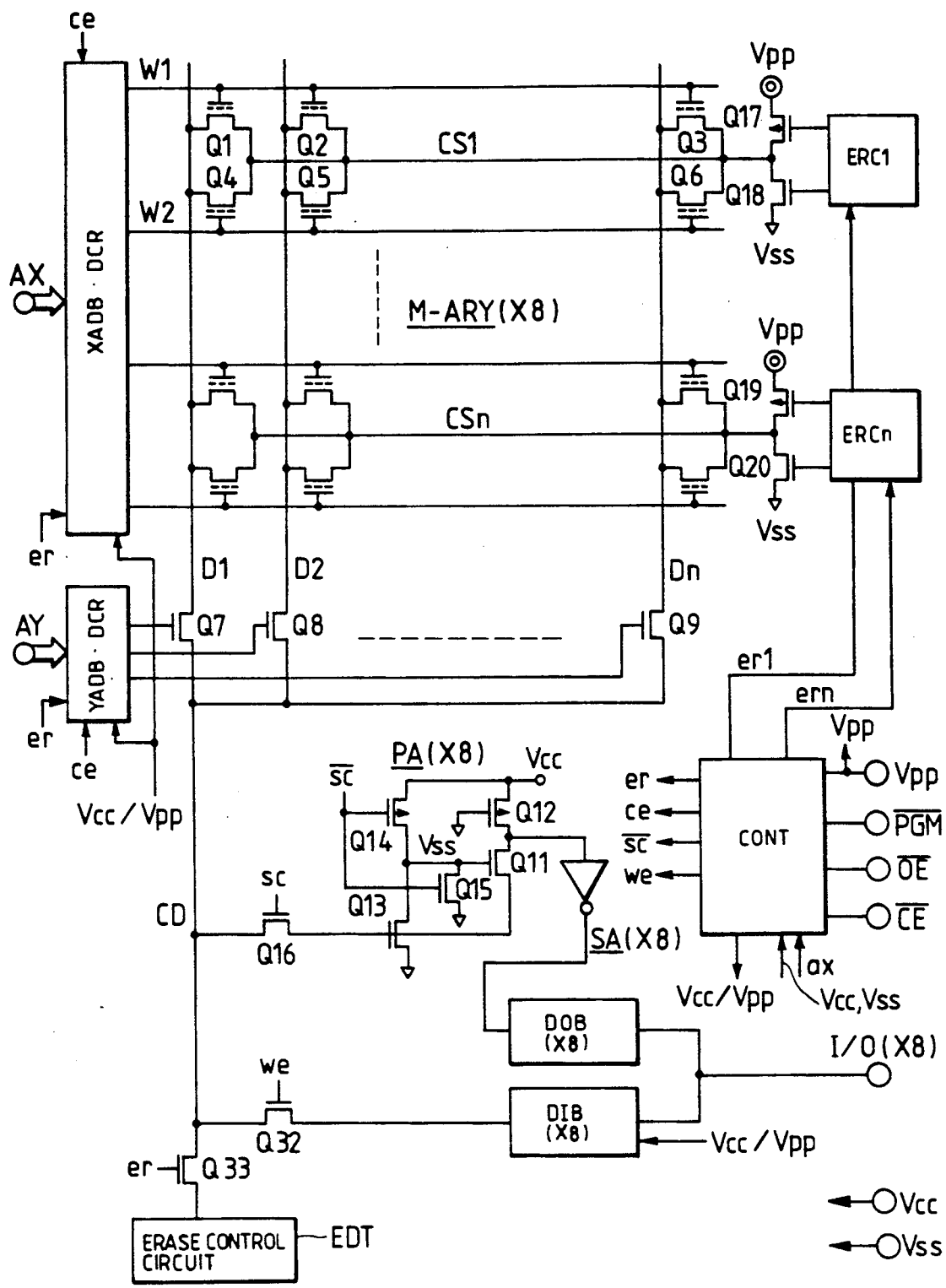
FIG. 1 is a circuit diagram showing an embodiment of an EEPROM according to the present invention.

Shown in FIG. 1 is a circuit diagram of an embodiment of the memory array portion of an EEPROM (electrically erasable and programmable read only memory) to which the present invention is applied. Although not especially restricted, various circuit elements in the figure are formed on a single semiconductor substrate such as single-crystal silicon by known techniques for manufacturing a CMOS (complementary MOS) integrated circuit.

Although no special restriction is intended, the integrated circuit of the embodiment is formed on the semiconductor substrate made of single-crystal P-type silicon. An N-channel MOSFET is configured of a source region and a drain region which are formed in the surface of such a semiconductor substrate, and a gate electrode of, e. g., polycrystalline silicon which is formed on the surface part of the semiconductor substrate between the source and drain regions through a thin gate insulator film. A P-channel MOSFET is formed on an N-type well region which is formed in the surface of the semiconductor substrate. Thus, the semiconductor substrate constructs the common substrate gate of a plurality of N-channel MOSFETs formed thereon, and it is supplied with the ground potential $V_{ss}$ of circuitry. The N-type well region constructs the substrate gate of the P-channel MOSFET formed thereon. The substrate gate of the P-channel MOSFET, namely, the N-type well region is coupled to a power source voltage $V_{cc}$ (about 5V).

Alternatively, the integrated circuit may well be formed on the semiconductor substrate made of single-crystal N-type silicon. In this case, an N-channel MOSFET and a nonvolatile memory element are formed on a P-type well region, and a P-channel MOSFET is formed on the N-type substrate.

Although no special restriction is meant, the EEPROM of this embodiment has address decoders DCR supplied with complementary address signals which are formed through address buffers ADB that receive X and Y address signals AX, AY fed from external terminals. In the figure, the address buffers ADB and the address decoders DCR are respectively shown as identical circuit blocks XADB·DCR, YADB·DCR. Although not especially restricted, the address buffers XADB and YADB are respectively activated by an internal chip select signal ce, thereby to accept the address signals AX and AY from the external terminals and to form the complementary address signals which consist of internal address signals inphase with and address signals antiphase to the address signals supplied from the external terminals. By the way, in FIGS. 1 et seq., marks "o" indicate external terminals with which integrated circuits are provided.

The row (X) address decoder (X)DCR forms a select signal for selecting a word line W from within a memory array M-ARY, in accordance with the complementary address signals from the address buffer XADB.

The column (Y) address decoder (Y)DCR forms a select signal for selecting a data line D from within the memory array M-ARY, in accordance with the complementary address signals from the address buffer YADB.

The memory array M-ARY is configured of memory elements (nonvolatile memory elements) of stacked gate structure having a control gate and a floating gate; word lines W1, W2, . . . ; and data lines D1-Dn. Although not especially restricted, each of the memory elements is structurally assimilated to the memory element of an EPROM. The erasing method of the embodiment, however, differs from that of the EPROM employing ultraviolet radiation in that, as will be described later, the erase operation of the memory element is electrically effected by utilizing the tunneling between the floating gate and the source thereof coupled to a source line.

In the memory array M-ARY, the control gates of the memory elements Q1–Q3 and Q4–Q6 arranged in the same rows are respectively connected to the corresponding word lines W1 and W2, while the drains (regions on one side or electrodes on one side) of the memory elements Q1 and Q4–Q3 and Q6 arranged in the same columns are respectively connected to the corresponding data lines D1–Dn. The sources (regions on the other side or electrodes on the other side) of the memory elements are coupled to the source lines (common lines) CS1–CSn. More specifically, in this embodiment, for the purpose of permitting partial erasure in one memory array M-ARY, a plurality of memory cells arranged in the shape of a matrix are divided into n blocks in the vertical direction of the memory array, and the respective blocks are provided with the source lines as representatively exemplified by CS1 and CSn. Each of the source lines CS1–CSn is provided with a corresponding one of N-channel MOSFETs Q18, Q20 that falls into its "on" state and affords the ground potential $V_{ss}$ of the circuitry to the corresponding source line in write/read operations, and a corresponding one of P-channel MOSFETs Q17, Q19 that supplies a high voltage $V_{pp}$ for erasure. The MOSFETs Q17 and Q18, Q19 and Q20, etc. are switch-controlled by erase controllers ERC1–ERCn.

The erase controllers ERC1–ERCn receive erase signals er1–ern to be described later, and they bring the P-channel MOSFETs Q17, Q19, etc. into their "on" states in an erase mode in which the signals er1–ern are set at a high level. They bring the N-channel MOSFETs Q18, Q20, etc. into their "on" states in any case other than the erase mode where the signals er1–ern are at a low level. Thus, the erase controllers ERC1–ERCn selectively afford the high voltage $V_{pp}$ for the erase operation and the ground potential $V_{ss}$ for the write/read operations, etc. to the source lines CS1–CSn. By the way, in case of subjecting the whole memory array M-ARY to a collective erase operation, all the signals er1–ern may be set at the high level, whereby the switch MOSFETs Q17, Q19, etc. are all brought into the "on" states so as to supply the sources of all the memory cells with the erasing high voltage.

In erasing the memory cells, although not especially restricted, the data lines of the pertinent block are held in their floating states or are connected to an erase control circuit EDT through column switch MOSFETs Q7–Q9 as well as a select gate (MOSFET Q33). The erase control circuit EDT is used in order to monitor current flowing through the memory cell under the erase operation, and to control the amount of erasure. In other words, the erase control circuit EDT is used in order to prevent the memory cell from being erased in excess. On the other hand, in the case of erasing the memory cell with the data line held in the floating state, the amount of erasure is set by a predetermined erasing period of time. In the case where the data lines are floated for the erase operations in this manner, the select gate (MOSFET Q33) and the erase control circuit EDT are omitted.

Although no special restriction is intended, memory arrays M-ARY as stated above and numbering eight in total are provided in order to write/read data in 8-bit unit. In FIG. 1, one memory array M-ARY having the n divided memory blocks as described above is representatively exemplified.

The respective data lines D1–Dn constituting the single memory array M-ARY are connected to a common data line CD through the column select switch MOSFETs Q7–Q9 which receive the select signals formed by the address decoder DCR(Y). Such common data lines CD are laid in correspondence with the respective memory arrays. The common data line CD has the output terminal of a writing data input buffer DIB connected thereto through a switch MOSFET Q32, the buffer DIB receiving write data which is input from an external terminal I/O. Likewise, in each of the other memory arrays M-ARY not shown, data lines D1–Dn are respectively provided with column select switch MOSFETs similar to the above, and they are supplied with select signals which are formed by the address decoder YDCR in correspondence with the respective column select switch MOSFETs.

The input terminal of a preamplifier circuit PA to be described below is coupled through a switch MOSFET Q16 to the common data line CD which is provided in correspondence with the memory array M-ARY. The preamplifier circuit PA constructs the input stage circuit of a sense amplifier SA.

The common data line CD exemplified in the figure is connected to the source of an amplifier MOSFET of N-channel type Q11 through the MOSFET Q16 which is brought into its "on" state by a read control signal sc. A load MOSFET of P-channel type Q12, which has the ground potential $V_{ss}$ of the circuitry applied to its gate through an external potential terminal $V_{ss}$, is interposed between the drain of the amplifier MOSFET Q11 and a power source voltage terminal $V_{cc}$. The load MOSFET Q12 performs the operation of causing a precharge current to flow through the common data line CD for the sake of the read operation.

In order to heighten the sensitivity of the amplifier MOSFET Q11, the voltage of the common data line CD passed through the switch MOSFET Q16 is supplied to the gate of a drive MOSFET Q13 serving as the input terminal of an inverting amplifier circuit which is configured of the N-channel type drive MOSFET Q13 and a P-channel type load MOSFET Q14. The output voltage of the inverting amplifier circuit is supplied to the gate of the amplifier MOSFET Q11. Further, in order to prevent a wasteful current consumption during the non-operating time interval of the sense amplifier SA, an N-channel MOSFET Q15 is interposed between the gate of the amplifier MOSFET Q11 and the ground potential point $V_{ss}$ of the circuitry. The gates of this MOSFET Q15 and the P-channel MOSFET Q14 are supplied with the operation timing signal $\overline{sc}$ of the sense amplifier SA in common.

In reading out the memory cell, the sense amplifier operation timing signal $\overline{sc}$ is set at its low level, to bring the MOSFET Q14 into its "on" state and the MOSFET Q15 into its "off" state. In accordance with written data, namely, held data, the memory cell has a threshold voltage which is high or low relative to the select level (substantially equal to $V_{cc}$) of the word line in the read operation.

In the read operation, in a case where the memory cell selected by the address decoders X-DCR and Y-DCR (in other words, the memory cell indicated by the X and Y address signals) is held in its "off" state in spite of the word line brought to the select level, the common data line CD is set at a high level of comparatively low potential by the current which is supplied through the MOSFETs Q12 and Q11. In contrast, in a case where the selected memory cell is held in its "on" state owing to the word line brought to the select level, the common data line CD is set at a low level of comparatively high potential.

On this occasion, the high level of the common data line CD is limited to the comparatively low potential in such a way that the output voltage of comparatively low level formed by the inverting amplifier circuit receiving the potential of this high level is supplied to the gate of the MOSFET Q11. On the other hand, the low level of the common data line CD is limited to the comparatively high potential in such a way that the voltage of comparatively high level formed by the inverting amplifier circuit receiving the potential of this low level is supplied to the gate of the MOSFET Q11. By limiting the high level and low level of signals on the common data line CD in this manner, the speed of the read operation can be heightened notwithstanding that capacitances, such as stray capacitances, which limit the rates of signal changes exist in the common data line CD, etc. That is, in such a case where data items from the plurality of memory cells are read out in succession, the period of time in which one level of the common data line CD is changed to the other level can be shortened. For the sake of the read operation of high speed thus far described, the conductance of the load MOSFET Q12 is set to be comparatively high.

By the way, the amplifying MOSFET Q11 carries out an amplifying operation of grounded-gate type source input and transmits its output signal to the sense amplifier SA constructed of a CMOS inverter circuit. The output signal of the sense amplifier SA is amplified though no special restriction is meant, and then sent from the external terminal I/O by a corresponding data output buffer DOB. Besides, the write signal supplied from the external terminal I/O is transmitted to the common data line CD through the data input buffer DIB. An input-stage circuit as well as a sense amplifier, a read circuit constructed of a data output buffer, and a write circuit constructed of a data input buffer, which are similar to the foregoing, are also interposed between a common data line and an external terminal which correspond to any other memory block.

Although not especially restricted, a control circuit CONT forms internal timing signals such as the internal control signals ce and $\overline{sc}$, the erase signals er1–ern, the reading low voltage $V_{cc}$/writing high voltage $V_{pp}$ which are selectively supplied to the address decoders XDCR and YDCR and the data input buffer DIB, and so forth, in accordance with the X-group internal address signal ax, and a chip enable signal, an output enable signal, a program signal and the writing/erasing high voltage which are respectively supplied to external terminals $\overline{CE}$, $\overline{OE}$, $\overline{PGM}$ and $V_{pp}$. Incidentally, the signal sc is formed by inverting the phase of the signal $\overline{sc}$.

If, in the state in which the writing/erasing high voltage $V_{pp}$ is supplied, the chip enable signal $\overline{CE}$ is at its low level, the output enable signal $\overline{OE}$ is at its high level and the program signal $\overline{PGM}$ is at its low level, then a write mode is established, and the control circuit CONT responds to these signals to deliver signals and voltages as explained below: The internal signal ce is set at the high level. The address decoder circuits XDCR, YDCR and the data input circuit DIB are supplied as the operating voltages thereof with the high voltage $V_{pp}$ which is higher than the power source voltage $V_{cc}$. Thus, the voltage of the word line to which the memory cell to have data written thereinto is coupled is rendered the high voltage $V_{pp}$. Besides, the voltage of the data line to which the memory element to have electrons injected into the floating gate thereof is coupled is rendered the same high voltage $V_{pp}$. In consequence, a channel saturation current flows through the memory element, and in a pinch-off region in the vicinity of the drain of the element coupled to the data line, electrons accelerated by a high electric field undergo ionization to create so-called hot electrons having high energy. Meanwhile, the voltage of the floating gate becomes a value determined by the voltage of the drain region, as well as the voltage of the control gate of the element to which the word line is coupled, and the capacitance between the substrate and the floating gate, as well as the capacitance between the floating gate and the control gate. Thus, the aforementioned hot electrons are attracted, and the potential of the floating gate becomes minus. In the read operation, therefore, this memory element is brought into its nonconductive state even when the potential of the word line to which the control gate is coupled is rendered the select state (for example, $V_{cc}$). In contrast, the drain of any other memory element into which the electrons are not injected is held at a low level at which the hot electrons are not created in the pinch-off region in the vicinity of the drain of the memory element during the write mode described above.

If the chip enable signal $\overline{CE}$ is at the low level, the output enable signal $\overline{OE}$ is at its low level, the program signal $\overline{PGM}$ is at its high level and the voltage $V_{PP}$ is the writing high voltage, then a verify mode is established, and the control signal CONT forms signals as explained below: The internal signals sc and ce are set at the high level. In the verify mode, the circuits XDCR, YDCR and DIB stated before are supplied as the operating voltages thereof with the low power source voltage $V_{cc}$ changed-over from the high voltage $V_{pp}$ mentioned before.

If the chip enable signal $\overline{CE}$ is at the low level, the output enable signal $\overline{OE}$ is at the low level, the program signal $\overline{PGM}$ is at the high level and the voltage $V_{pp}$ is the reading low voltage (the same level as the voltage $V_{cc}$), then the read mode as explained before is established, and the control circuit CONT sets the internal signals sc and ce at the high level.

If the chip enable signal $\overline{CE}$ is at the low level, the output enable signal $\overline{OE}$ is at the high level, the program signal $\overline{PGM}$ is at the high level and the voltage $V_{pp}$ is the high voltage, then the erase mode is established, and the control circuit CONT forms signals as explained below: The internal signal ce is set at the high level ($V_{cc}$), and the signal sc at the low level ($V_{ss}$). By the way, apart from the combination of the signals as mentioned above, the erase mode may well be designated so as to deliver the aforementioned signals from the control circuit CONT in such a way that a control signal instructive of the erase operation is supplied from an external terminal and is set at its low level. In the erase mode, an address signal for specifying the block to be erased is accepted through the X address buffer. To this end, the internal signal ce is set at the high level so as to activate the X address buffer. The address signal accepted at this time is used as the address signal ax which is supplied to the control circuit CONT, and the address signal which is supplied to the address decoder circuit XDCR is invalidated as will be described below.

Here in the erase mode, the X decoder circuit DCR sets all the word lines at an unselect level such as the ground potential ($V_{ss}$) by the use of an internal control signal er. On this occasion, the address signal which is supplied to the X decoder circuit XDCR is invalidated. However, the address signal ax passed through the address buffer XADB is supplied to the control circuit CONT and is used for designating the memory block to-be-erased. In this case, an internal address signal which corresponds to predetermined n bits within the address signal AX supplied through the external terminals from outside the integrated circuit may well be used as the address signal ax. Herein, the internal address signal ax of the n bits may well be so used that the individual bits are held in one-to-one correspondence with the n divided memory blocks. In other words, the individual bits of the address signal are held in one-to-one correspondence with the erase signals er1–ern. Among the n divided memory blocks, any desired number of memory blocks can be erased by adopting such a scheme. That is to say, the combinations of the signals er1–ern make it possible to realize multifarious aspects of partial erasure in addition to the same collective erasure as in the prior art. Accordingly, in a case where the number of the memory blocks is smaller than that of the bits of the external address signal AX, the internal address signal ax is smaller in the number of bits than the external address signal AX. In this case, the unessential part of the internal address signal corresponding to the surplus part of the external address signal is not supplied to, for example, the control circuit CONT.

As described above, in the erase mode, all the word lines are at the unselect level such as ground potential, and at least one of the source lines CS1 thru CSn is supplied with the erasing high voltage $V_{pp}$ by the designation of the address signal ax supplied to the control circuit CONT. Therefore, a high electric field directed from the control gate to the source acts in each of the plurality of memory elements which are coupled to the source line (for example, CS1) designated by the address signal ax, and the electrons stored in the floating gates of the memory elements Q1 etc. are extracted to the source line side by tunneling, whereby the operation of erasing data is effected.

When, in the erase mode thus far described, the ground potential is applied to any of the source lines CS1–CSn by bringing the corresponding one of the MOSFETs Q18–Q20 into the "on" state, the high electric field as described above does not act, and hence, the aforementioned tunneling does not arise. Thus, in the plurality of divided memory blocks of the memory array M-ARY, the high voltage $V_{pp}$ is applied to the source line or lines designated by the internal address signal ax, and only the memory elements coupled thereto are erased as part of this memory array.

Figure 2:
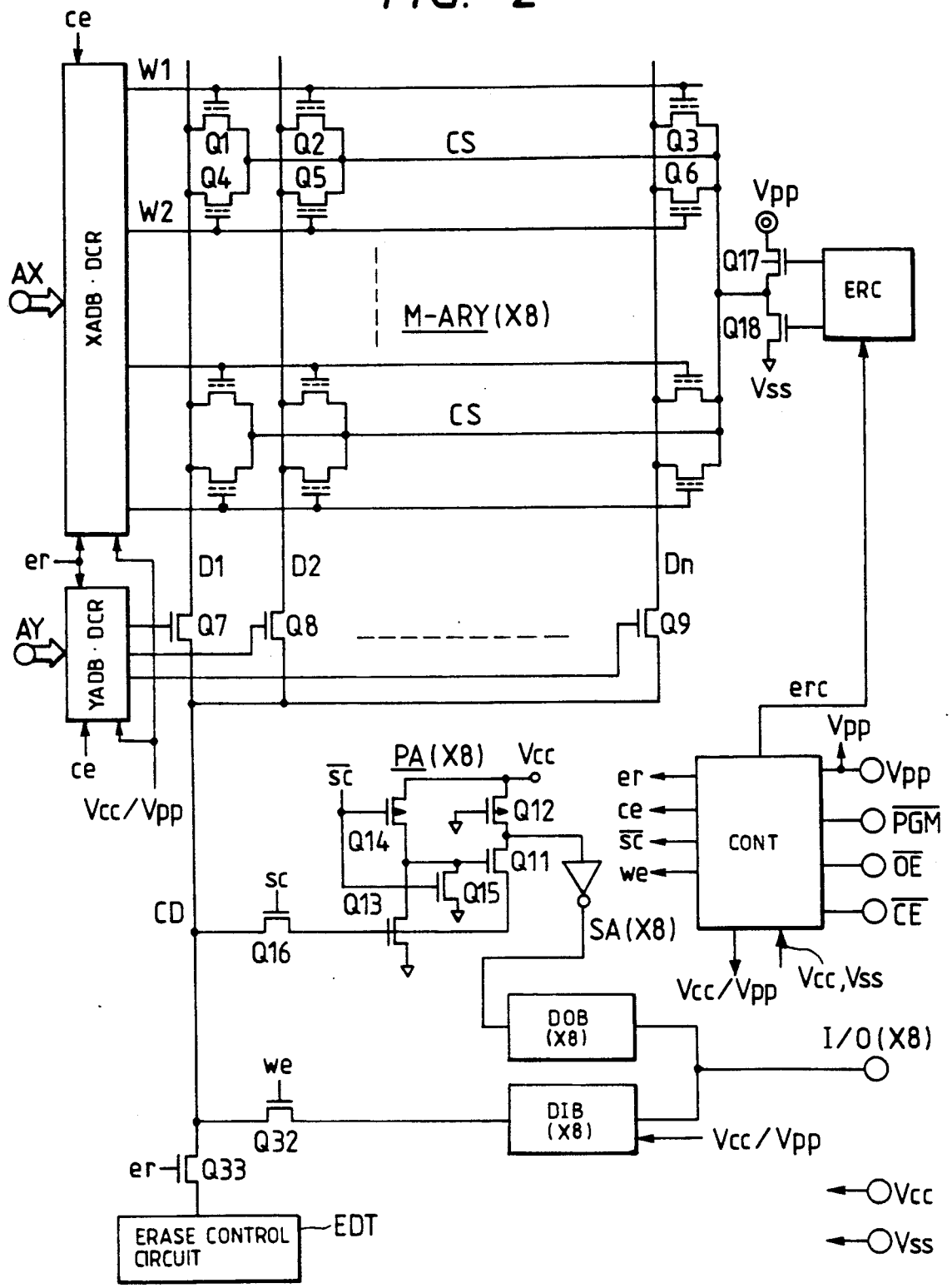
FIG. 2 is a circuit diagram showing another embodiment of the EEPROM according to the present invention.

FIG. 2 shows a circuit diagram of another embodiment of the present invention.

In this embodiment, in an EEPROM similar to the foregoing one, the source lines of a memory array M-ARY are connected in common and are collectively supplied with an erase voltage $V_{pp}$ or a writing/reading ground potential $V_{ss}$ by a P-channel MOSFET Q17 and an N-channel MOSFET Q18. More specifically, when an erase mode is instructed, an erase mode instruction signal erc is output from a control circuit CONT. In response to the signal erc indicative of the erase mode, an erase controller ERC brings the P-channel MOSFET Q17 into its "on" state, thereby to set all the source lines CS at the high voltage $V_{pp}$ simultaneously. In any mode other than the erase mode, the erase controller ERC brings the N-channel MOSFET Q18 into its "on" state, thereby to set all the source lines CS at the ground potential $V_{ss}$ of circuitry.

In this case, for the purpose of realizing the partial erasure of the memory array M-ARY, an X decoder circuit DCR sets word lines at the high voltage $V_{pp}$ higher than a power source voltage $V_{cc}$ or at the ground potential $V_{ss}$ of the circuitry selectively. That is, the X decoder circuit DCR sets, for example, the plurality of word lines corresponding to memory blocks to-be-erased at an unselect level such as the ground potential $V_{ss}$ of the circuitry locally and sets the other word lines at a select level equal to the high voltage $V_{pp}$, unlike the operation of setting one word line indicated by an address signal AX at the select level and all the remaining word lines at the unselect level as in a write operation. In other words, the X decoder circuit DCR supplies the unselect level ($V_{ss}$) to, for example, both the word lines included in each memory block to-be-erased and supplies the high voltage $V_{pp}$ to the other word lines. With this scheme, in a plurality of memory elements which are coupled to each of the word lines set at the unselect level, a high electric field as stated before acts to effect an erase operation based on tunneling. In contrast, in a plurality of memory elements which are coupled to each of the word lines set at the high voltage $V_{pp}$, the control gates and sources of the elements become equipotential and do not undergo the high electric field as stated before, so that the erase operation based on the tunneling is not performed.

Besides, as in the preceding embodiment, in erasing the memory cells of the memory array M-ARY, the data lines of the pertinent block or blocks are brought into their floating states or are connected to an erase control circuit EDT through column switch MOSFETs Q7–Q9 and a select gate (MOSFET Q33). The erase control circuit EDT is used in order to monitor current flowing through the memory cell under the erase operation, and to control the amount of erasure. In other words, the erase control circuit EDT is used in order to prevent the memory cell from being erased in excess. On the other hand, in the case of erasing the memory cell with the data line held in the floating state, the amount of erasure is set by a predetermined erasing period of time. In the case where the data lines are floated for the erase operations in this manner, the select gate (MOSFET Q33) and the erase control circuit EDT are omitted.

Figure 3:
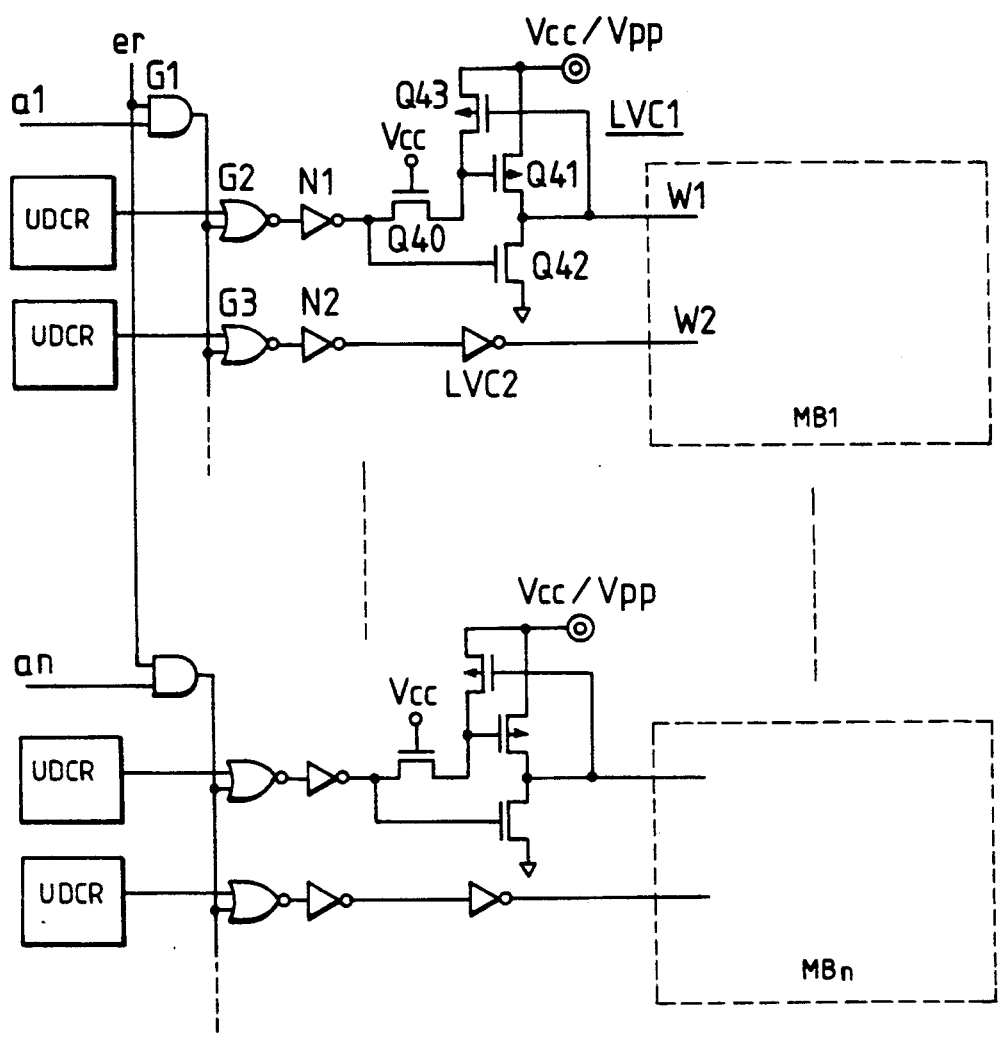
FIG. 3 is a circuit diagram showing an embodiment of a decoder circuit in the EEPROM.

FIG. 3 shows a circuit diagram of an embodiment of the X decoder circuit DCR.

A memory array M-ARY is configured of n divided memory blocks MB1 thru MBn as indicated by dotted lines.

The output signal of each of unit decoder circuits UDCR which form select signals for respective word lines W1, W2 etc. included in the memory block MB1 is supplied to one input terminal of a corresponding one of NOR gate circuits G2, G3 etc. The other input terminals of the NOR gate circuits G2, G3 etc. are supplied in common with an address signal a1 through an AND gate circuit G1 which receives the erase control signal er. Thus, the output signal of the AND gate circuit G1 is used as the common control signal of the NOR gate circuits G2, G3 etc. which are disposed on the output sides of the unit decoder circuits corresponding to the memory block MB1.

The output signals of the NOR gate circuits G2, G3 etc. are respectively passed through inverter circuits N1, N2 etc., and the inverted signals are respectively supplied to the corresponding word lines W1, W2 etc. through level conversion circuits LVC1, LVC2 etc. As illustrated by the practicable circuit thereof, the level conversion circuit LVC1 is configured of circuit elements stated below: The output signal of the inverter circuit N1 is supplied to the gate of a P-channel MOSFET Q41 through a cutting MOSFET Q40 whose gate is steadily supplied with the power source voltage $V_{cc}$. The gate of an N-channel MOSFET Q42 is directly supplied with the output of the inverter circuit N1 though not especially restricted. Instead of this scheme, the gate of the N-channel MOSFET Q42 may well be connected with that of the P-channel MOSFET Q41. A P-channel MOSFET Q43 whose gate receives a signal to serve as the output of the level conversion circuit LVC1 is inserted between the gate of the P-channel MOSFET Q41 and a node $V_{cc}/V_{pp}$ which is supplied with the high voltage $V_{pp}$. Each of the other level conversion circuits LVC2 etc. has the same circuit arrangement as described above.

In this embodiment, when the erase mode is instructed, the erase mode signal er of high level ($V_{cc}$: logic "1") is output from the control circuit CONT. Thus, the AND gate circuits G1 are enabled to validate address signals a1–an (X-group internal address signals though not especially restricted), and these signals are respectively transmitted to the level conversion circuits through the corresponding NOR gate circuits G2, G3 etc. in place of the decode outputs of the unit circuits UDCR. By way of example, when the address signal a1 is held at the high level, the output signals of the NOR gate circuits G2, G3 etc. become their low level, to set the word lines W1, W2 etc. of the memory block MB1 at the unselect level of low level ($V_{ss}$) and to bring memory cells within the memory block MB1 into erased states. On this occasion, the level conversion circuit, e. g., LVC1 sets the word line W1 at the ground potential of the low level in such a manner that the N-channel MOSFET Q42 is brought into its "on" state by the high level of the output signal of the inverter circuit N1. In accordance with the low level of the word line W1, the P-channel MOSFET Q43 falls into its "on" state and brings the gate voltage of the P-channel MOSFET Q41 to the high voltage $V_{pp}$. Thus, the P-channel MOSFET Q41 is brought into its "off" state. Besides, in accordance with the gate voltage of the MOSFET Q41 rendered the voltage $V_{pp}$, the N-channel MOSFET Q40 falls into its "off" state, so that a direct current can be prevented from flowing from the high voltage $V_{pp}$ toward the operating voltage $V_{cc}$ of the inverter circuit N1.

On the other hand, when the address signal a1 is set at the high level, the output signals of the NOR gate circuits G2, G3 etc. become their high level, to set the word lines W1, W2 etc. of the memory block MB1 at the high level such as the voltage $V_{pp}$. More specifically, the level conversion circuit, e. g., LVC1 sets the word line W1 at the high level of the high voltage $V_{pp}$ in such a manner that the P-channel MOSFET Q41 is brought into its "on" state by the low level of the output signal of the inverter circuit N1. At this time, the N-channel MOSFET Q42 falls into its "off" state. These operations hold true of the address signals a2–an which are respectively held in one-to-one correspondence with the other memory blocks MBn etc.

As thus far described, regarding the individual decoder circuits which are divided in n in correspondence with the n divided memory blocks MB1–MBn, each address signal composed of n bits is delivered instead of the outputs of the n divided decode portions, so that the levels of the n divided word lines can be respectively designated in one-to-one correspondence by the n bits constituting each address signal. With this construction, multifarious erase operations of the memory blocks including the collective erasure thereof become possible as in the foregoing.

In any mode other than the erase operation mode, the signal er is set at the low level, so that all the NOR gates G2, G3 etc. operate as mere inverter circuits and transmit the output signals of the corresponding unit decoder circuits UDCR. In addition, although no illustration is done in FIG. 3, each of the unit decoder circuits UDCR is supplied with the complementary address signals from the address buffer (XADB) and forms a select signal conforming to the address signal AX in a read operation mode etc. Further, although no special restriction is meant, each of the unit decoder circuits UDCR is supplied with the signal er and forms an output signal of low level in response to this signal er rendered the high level.

The NOR gate circuits G2, G3 etc. can be used also in the case of setting all the word lines at the unselect level in the embodiment of FIG. 1.

Incidentally, the X decoder circuit DCR may well be so constructed that the word lines to be set at the unselect level such as ground potential $V_{ss}$ are designated by validating only the N bits, e. g., the upper 2 or 3 bits of the address signal in accordance with the signal er. In this case, the word lines of the memory array M-ARY are divided in 4, and memory blocks divided into $\frac{1}{2}^N$, such as $\frac{1}{4}$ and $\frac{1}{8}$, can be selectively erased.

A circuit arrangement which divides the word lines of the memory array M-ARY in a plural number and selectively sets them at the high voltage $V_{pp}/$ the ground potential $V_{ss}$ in this manner, can adopt various aspects of performance. By the way, if the number of bits of the X address signal is smaller than the number of the memory blocks in the above case of designating the memory blocks in one-to-one correspondence with the address signal, the Y address signal may well be also utilized. This applies also to the case of designating the source lines in FIG. 1. Alternatively, the Y address signal may well be used in liue of the X address signal.

The node $V_{cc}/V_{pp}$ of the level conversion circuit is supplied with the high voltage $V_{pp}$ from the control circuit CONT in the erase mode and write mode, and with the power source voltage $V_{cc}$ therefrom in the read mode and verify mode.

Figure 6:
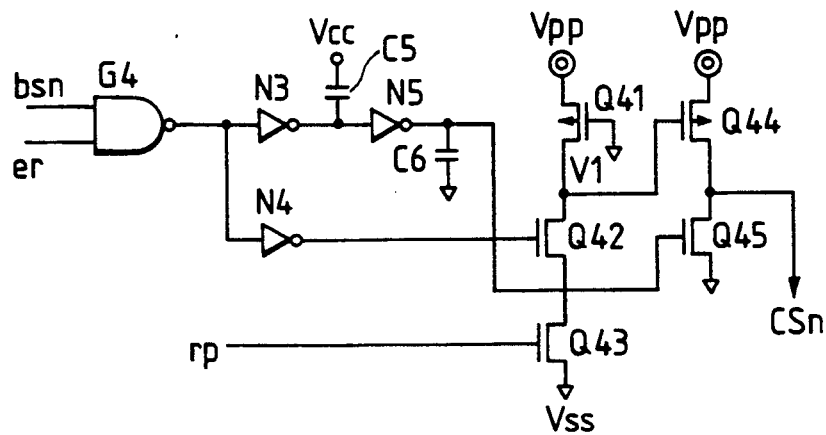
FIG. 6 is a circuit diagram showing an embodiment of a source line selector circuit.

FIG. 6 shows a circuit diagram of an embodiment of a source line selector circuit. This source line selector circuit corresponds to each of the erase controllers ERC1-ERCn in FIG. 1 and to the erase controller ERC in FIG. 2, but it is not such an erase controller itself.

In the erase mode, the internal signal er is set at the high level as described before, and a block select signal bsn is set at its high level for the memory block to-be-selected. The block select signal is held in one-to-one correspondence with the address signal accepted through the external terminals in the erase operation mode as stated before, or it is formed in such a way that the accepted address signal composed of the plurality of bits is decoded by a proper decoder circuit. Thus, the output signal of a NAND gate circuit G4 becomes its low level and is passed through an inverter circuit N4 so as to form an output signal of high level. Therefore, a MOSFET Q42 falls into its "on" state, and the potential of a node V1 lowers gradually in correspondence with the fact that a MOSFET Q43 whose gate receives the output signal rp of a ramp-rate setting circuit to be described later falls into its "on" state gradually. A P-channel MOSFET Q44 of source follower output falls into its "on" state gradually in correspondence with the lowering of the potential of the node V1. Thus, the source line CSn is fed with the high voltage $V_{pp}$ which changes in correspondence with the potential change of the node V1. On this occasion, a MOSFET Q45 whose gate receives a signal obtained by passing the block select signal bsn through the NAND gate circuit G4 as well as inverter circuits N3 and N5 is held in its "off" state.

When the erase operation has ended or when the memory block to be erased is changed-over, a through current might flow between the P-channel load MOSFET Q44 and the drive MOSFET Q45. In order to avoid this drawback, a delay circuit which is configured of the inverter circuits N3, N5 and capacitors C5, C6 is provided so that the timing at which the drive MOSFET Q45 falls into its "on" state may have a delay of about 10 ns with respect to the output change timing of the gate circuit G4. Also in an operation reverse to the above, there is the possibility that a through current will flow similarly. In this case, however, no problem is posed because a sufficient delay based on the ramp-rate setting circuit is involved before the timing at which the MOSFET Q43 falls into the "on" state. By the way, the MOSFETs Q44 and Q45 correspond to the MOSFETs Q17 and Q18, or Q19 and Q20 in FIG. 1. Besides, it is to be understood that each of the signals er1 thru ern in FIG. 1 corresponds to the combination of the signal er and the block select signal bsn in FIG. 6. Further, in a case where the ramp-rate setting circuit to be described later is not provided in the device of FIG. 1, the MOSFET Q43 is dispensed with, and the ground potential $V_{ss}$ of the circuitry is supplied to the MOSFET Q42. Besides, in the device of FIG. 2, the gate circuit G4 may be replaced with an inverter circuit which inverts the signal er. In the case where the ramp-rate setting circuit is not provided, the measure stated above may be similarly applied.

Figure 4:
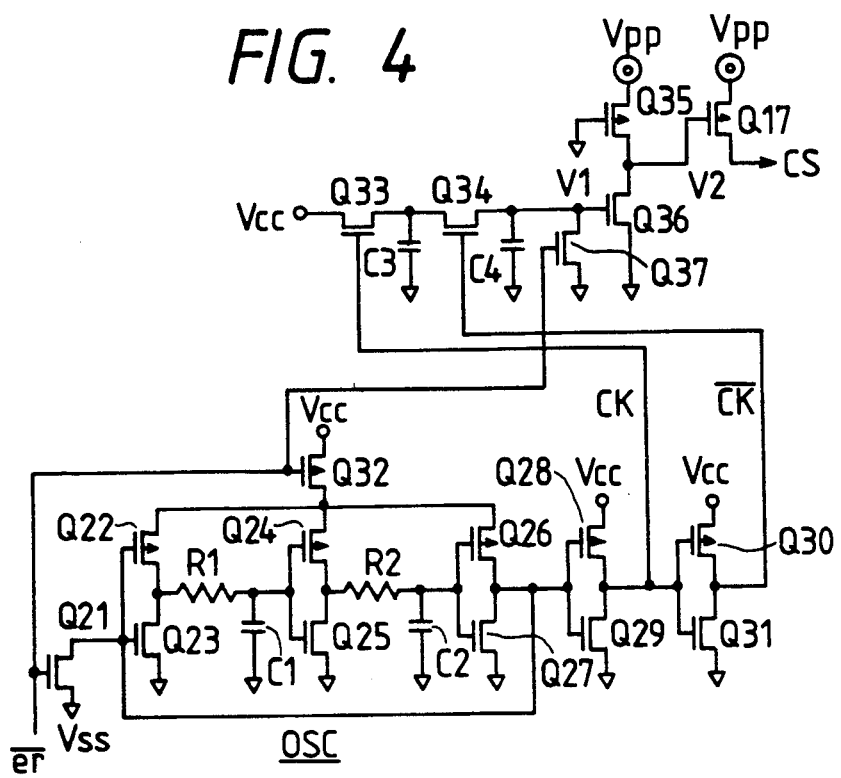
FIG. 4 is a circuit diagram showing an embodiment of a ramp voltage generator circuit by which an erasing high voltage to be supplied to a source line is generated.
Figure 5:
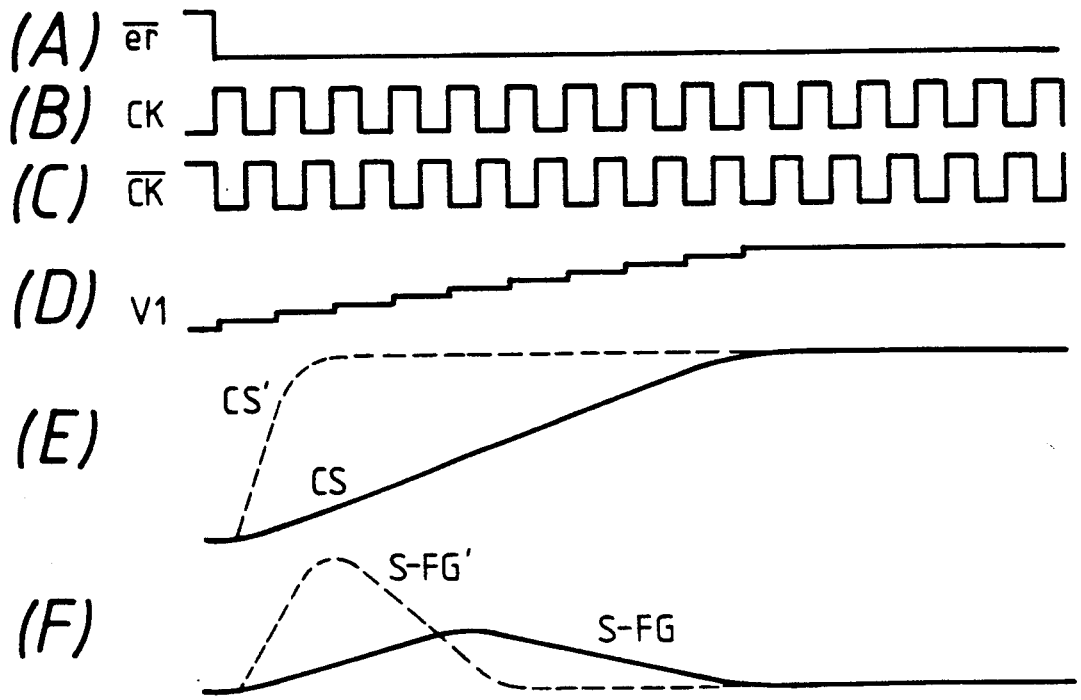
FIGS. 5(A)-5(F) are waveform diagrams for explaining the operation of the ramp voltage generator circuit.

FIG. 4 shows a circuit diagram of an embodiment of a ramp voltage generator circuit by which the erasing high voltage to be supplied to the source line is generated.

In a case where an erase operation is carried out by supplying a high voltage to the source of a memory cell, the potential of a source line rises to the high voltage such as the high voltage $V_{PP}$ (about 12V) at the same time as the start of the erase operation with the construction wherein the high voltage $V_{pp}$ to be supplied to the source line from outside is directly fed by a switch MOSFET or the like. Since, on this occasion, the floating gate of the memory element to be erased stores electrons therein, it has a minus potential lower than the ground potential $V_{ss}$. Therefore, an excessive high electric field as stated below acts between the floating gate and the source, and it is apprehended that an insulator film interposed between the floating gate and the source will be deteriorated or destroyed. This is problematic in point of reliability for the reason, for example, that the data holding characteristics of the memory element degrade.

In this embodiment, therefore, the control signal which is supplied to the gate of each of the switch MOSFETs Q17 (Q19) etc. for effecting the erase operation in the embodiment of FIG. 1 or FIG. 2 is formed by the following circuit arrangement:

The corresponding pairs of P-channel MOSFETs Q22, Q24 and Q26 and N-channel MOSFETs Q23, Q25 and Q27 construct CMOS inverter circuits, respectively. Although not especially restricted, the output signal of the CMOS inverter circuit (Q22 and Q23) is supplied to the input node of the CMOS inverter circuit (Q24 and Q25) through a delay circuit which is configured of a resistor R1 and a capacitor C1. The output signal of this CMOS inverter circuit (Q24 and Q25) is supplied to the input node of the CMOS inverter circuit (Q26 and Q27) through a delay circuit which is configured of a resistor R2 and a capacitor C2. The output signal of this CMOS inverter circuit (Q26 and Q27) is fed back to the input node of the CMOS inverter circuit (Q22 and Q23). Thus, a ring oscillator OSC is constructed. In this embodiment, in order to lower the power consumption of the circuit, the operating voltage $V_{cc}$ to be supplied to the sources of the P-channel MOSFETs Q22, Q24 and Q26 of the CMOS inverter circuits is fed through a power switch MOSFET of P-channel type Q32. In addition, a resetting N-channel MOSFET Q21 is interposed between the input node of the CMOS inverter circuit (Q22 and Q23) and the ground potential point $V_{ss}$ of the circuitry. The gates of the power switch MOSFET Q32 and the resetting MOSFET Q21 are supplied with an internal signal $\overline{er}$ which is obtained by inverting the phase of the erase signal er formed as described before.

The output signal of the ring oscillator OSC is passed through CMOS inverter circuits of cascade form which are respectively configured of the corresponding pairs of P-channel MOSFETs Q28, Q30 and N-channel MOSFETs Q29, Q31, whereby cyclic complementary pulses CK and $\overline{CK}$ are output.

The pulses CK are transmitted to the gate of a transfer gate MOSFET Q33 which transmits the power source voltage $V_{cc}$ to a capacitor C3. On the other hand, the pulses $\overline{CK}$ are transmitted to the gate of a transfer gate MOSFET Q34 by which electrons charged up in the capacitor C3 are transmitted to a capacitor C4. The capacitor C4 is set so as to have a capacitance which is sufficiently higher than that of the capacitor C3. A resetting MOSFET Q37 whose gate receives the signal $\overline{er}$ is disposed in parallel with the capacitor C4.

A voltage V1 held in the capacitor C4 is transmitted to the gate of an N-channel MOSFET Q36 which has the ground potential $V_{ss}$ applied to its source. A P-channel MOSFET Q35 is connected between the drain of the MOSFET Q36 and the high voltage $V_{pp}$. The P-channel MOSFET Q35 has its gate steadily supplied with the ground potential $V_{ss}$ of the circuitry, thereby to function as a resistor element. A voltage V2 thus divided by the MOSFETs Q35 and Q36 is used as a drive voltage which is supplied to the gate of the switch MOSFET, e. g., Q17 for applying the erase voltage to the source line as stated before. By the way, although omitted from FIG. 4, the MOSFET Q18 for applying the ground potential $V_{ss}$ to the source line CS is disposed in series with the MOSFET Q17 as illustrated in FIG. 1 or FIG. 2. This MOSFET Q18 or the like is supplied with a proper control signal, thereby to be brought into its "on" state and feed the ground potential $V_{ss}$ except for the erase operation of the memory array M-ARY or the memory block to which the pertinent source line belongs. Thus, the write operation, the read operation, etc. as described before are performed.

Next, the operation of the circuit arrangement of this embodiment will be described with reference to operating waveform diagrams shown in FIGS. 5(A)-5(F).

When the signal $\overline{er}$ is set at its low level, the N-channel MOSFET Q21 falls into its "off" state, and the power switch MOSFET Q32 falls into its "on" state. Therefore, the ring oscillator OSC starts an oscillating operation, and the pulses CK and $\overline{CK}$ change to their high level/low level alternately. When the pulse CK is at the high level, the transfer gate MOSFET Q33 falls into its "on" state, and the capacitor C3 is charged up to ($V_{cc}$ - $V_{th}$) where $V_{th}$ denotes the threshold voltage of the MOSFET Q33. When the pulse signal $\overline{CK}$ becomes the high level, the MOSFET Q34 falls into its "on" state in lieu of the transfer gate MOSFET Q33, and hence, the charges are shared by the capacitors C3 and C4. The capacitor C4 is discharged by the MOSFET Q37 which is brought into its "on" state when the signal $\overline{er}$ is at its high level, so that this capacitor comes to have the potential V1 which corresponds to the charges transmitted by the charge sharing. Since the pulses CK and $\overline{CK}$ are recurrently generated, the potential V1 of the capacitor C4 is gradually raised in a stepped wave state by the charge sharing. The conductance of the MOSFET Q36 increases gradually in accordance with the potential rise of the voltage V1. Therefore, that drain output V2 of the MOSFET Q36 which is determined by the conductance ratio between the MOSFETs Q35 and Q36 lowers gradually from the high voltage $V_{pp}$ toward the ground potential $V_{ss}$. Since also the conductance of the MOSFET Q17 is gradually increased in accordance with such lowering of the voltage V2, the erase voltage to be supplied to the source line CS is heightened with ramp-rate characteristics corresponding to the stepped wave voltage V1 as indicated by a solid line in FIG. 5(E). Incidentally, a voltage CS' indicated by a dotted line illustrates the voltage of the source line in the case where the high voltage $V_{pp}$ is supplied to the source line through the switch MOSFET as described before.

Owing to the supply of the erase voltage having such a ramp rate, the extraction of the charges is started when a high voltage required for tunneling has been developed between the floating gate and source of each memory element to-be-erased. Accordingly, when the potential of the source has finally become the high voltage $V_{pp}$, a certain amount of charges among the charges which had been stored in the floating gate have already been extracted. Therefore, a voltage (S - FG) which acts between the floating gate and the source becomes a voltage which changes moderately as indicated by a solid line in FIG. 5(F), and an excessive high electric field, e. g., a voltage (S - FG)' (a voltage acting between the floating gate and the source) in the case of the abrupt rise of the source line potential, as indicated by a dotted line in FIG. 5(F), can be prevented from appearing. Thus, it is possible to avoid the deterioration or destruction of the insulator film etc. between the floating gate and the source as is attendant upon the erase operation, and the high reliability of the element can be guaranteed.

In the embodiment of FIG. 6, the voltage V1 shown in FIG. 4 is used as the signal rp shown in FIG. 6.

Functional effects which are attained by the embodiments thus far described are as follows:

(1) For a memory array wherein nonvolatile semiconductor memory elements each having a control gate and a floating gate are arranged in the shape of a matrix, source lines are divided and laid into a plurality of blocks, and with all word lines held in unselect states, the individual blocks are selectively supplied with an erasing high voltage, thereby to achieve the effect that an erase operation is permitted every block.

(2) For a memory array wherein nonvolatile semiconductor memory elements each having a control gate and a floating gate are arranged in the shape of a matrix, word lines are divided into a plurality of blocks, and in the state in which an erasing voltage is supplied to the source line of the memory array, the word lines of the individual blocks are selectively set at a ground potential level, thereby to achieve the effect that an erase operation is permitted every block.

(3) As control signals for erasing the individual blocks, signals held in one-to-one correspondence with address signals are formed, thereby to achieve the effect that erase operations based on multifarious combinations of the blocks, including the collective erasure of the whole memory array, are permitted.

(4) The potential of the source line to which the source of the nonvolatile semiconductor memory element to be erased is coupled is endowed with a ramp rate for gradually raising the potential from a low voltage to a high voltage, whereby charges stored in the floating gate are already extracted by tunneling before the voltage of the source reaches a high voltage $V_{pp}$, and hence, an excessive intense electric field can be prevented from being applied between the floating gate and the source. This brings forth the effect that the high reliability of the element can be guaranteed.

Figure 7:
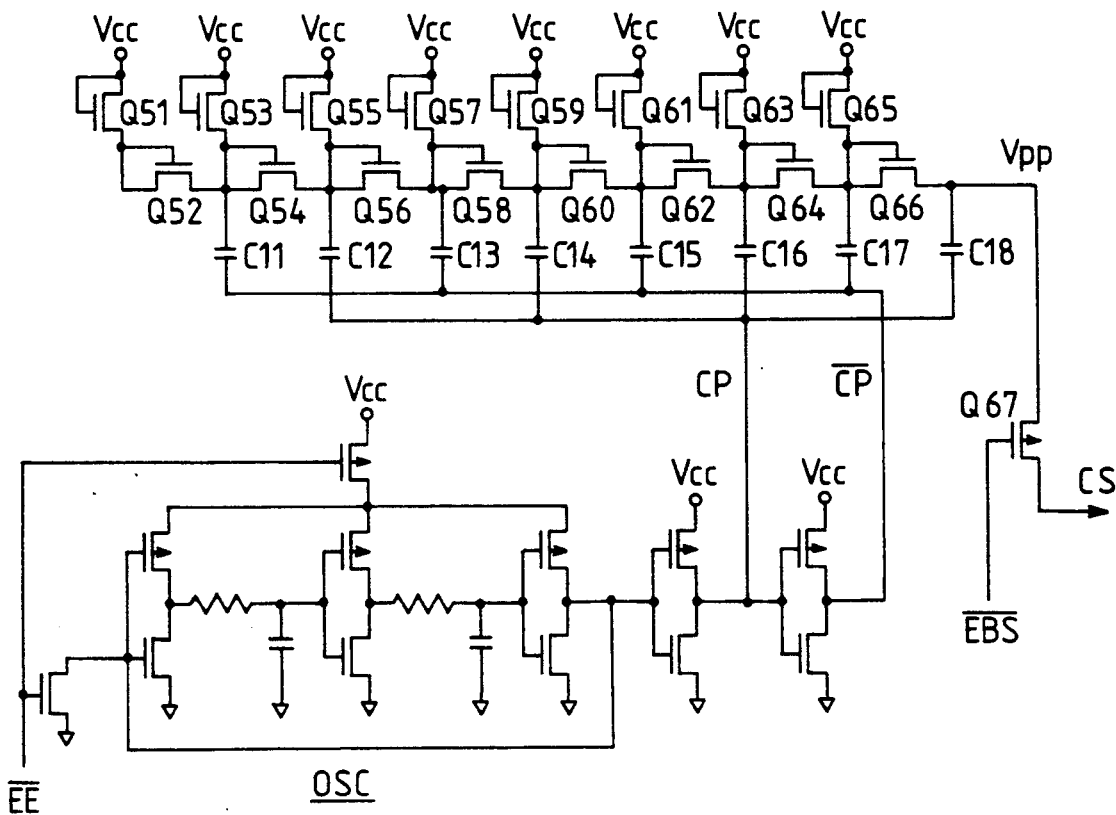
FIG. 7 is a circuit diagram showing an embodiment of a built-in high voltage generator circuit.

Although, in the above, the invention made by the inventor has been concretely described on the basis of embodiments, it is needless to say that the present invention is not restricted to the foregoing embodiments, but that it can be variously altered within a scope not departing from the purport thereof. By way of example, the source lines and word lines may well be respectively divided, whereby the memory blocks to be erased are designated by the combinations thereof. As the memory elements, nonvolatile memory elements of FLOTOX (floating gate tunnel oxide) type which utilize tunneling also for write operations may well be employed, apart from the MOS transistors of stacked gate structure which are employed for EPROMs. The writing/erasing high voltage $V_{pp}$ may well be formed by boosting the power source voltage $V_{cc}$ by the use of a charge pump circuit as shown in FIG. 7, which is constructed of an internal circuit and which is configured of MOSFETs of diode connection Q51 thru Q66 and capacitors C11 thru C18 that receive the power source voltage $V_{cc}$ and timing pulses CP, $\overline{CP}$ generated by an oscillator circuit OSC being similar in arrangement to the circuit shown in FIG. 4. Also in this scheme, with a measure in which the operation of the booster circuit is started by a control signal $\overline{EE}$ in the erase operation mode, the erase voltage to be supplied to the source line CS can be raised with a ramp rate by utilizing a boosting function based on charge pumping. The gate of an output MOSFET Q67 is supplied with a block erase signal $\overline{EBS}$. Thus, the selective erase operation in block unit is permitted as in the foregoing embodiments. In performing the collective erasure, the erase signal $\overline{EE}$ can be used instead of the signal $\overline{EBS}$. This erase control signal $\overline{EE}$ may be supplied from an external terminal, or may alternatively be formed by the combination with another control signal as described before. Incidentally, although not shown in FIG. 7, a MOSFET for applying the ground potential $V_{ss}$ to the source line CS is disposed in series with the MOSFET Q67. The unshown MOSFET is supplied with a proper control signal, thereby to be brought into its "on" state and apply the ground potential $V_{ss}$ to the source line CS, except for the erase operation of the memory array M-ARY or memory block to which the pertinent source line belongs.

The external control signals which are supplied to the memory device can assume various aspects of performance. The foregoing scheme for bestowing the ramp rate on the high voltage which is supplied to the sources of the memory elements to-be-erased, can adopt the circuit based on charge sharing as described before, or any of other various aspects of performance such as a time constant circuit which is configured of capacitors and resistors, an integrator circuit which utilizes an operational amplifier circuit, and a D/A (digital-to-analog) converter circuit which is combined with a counter circuit so as to receive the count output thereof. The EEPROM which is erased by the high voltage having the ramp rate in this manner, may well be a flush type EEPROM which has only the collective erase mode as stated before.

The practicable circuit arrangements of the memory array and its peripheral circuits which constitute the EEPROM can adopt various aspects of performance. Further, the EEPROM etc. may well be built in a digital semiconductor integrated circuit device such as microcomputer.

The present invention is extensively applicable to nonvolatile memory elements of stacked gate structure as are employed for EPROMs, and to nonvolatile semiconductor memory devices which employ FLOTOX type memory elements.

Effects which are brought forth by typical aspects of performance of the present invention will be briefly explained below: A high voltage is selectively exerted between word lines to which the control gates of nonvolatile semiconductor memory elements are coupled and source lines to which the sources of the nonvolatile semiconductor memory elements are coupled, so as to extract charges stored in the floating gates to the sides of the source lines, whereby partial erasure becomes possible. In addition, a potential to be supplied to the source lines to which the sources of the nonvolatile semiconductor memory elements to be erased are coupled is endowed with ramp-rate characteristics according to which the potential gradually rises from a low voltage to a high voltage, whereby an excessive intense electric field can be prevented from acting between the floating gates and the sources.

What is claimed is:

1. A nonvolatile semiconductor memory device including a memory array having a plurality of memory cells, each of which includes one nonvolatile semiconductor memory transistor having a control gate, a source and a floating gate, said device comprising an erase operation mode in which charges stored in said floating gate are extracted through source line coupled to said sources of said memory transistors in such a way that word lines to which the control gates of the nonvolatile memory transistors to be erased are coupled are set at a ground potential, such that a potential of the source lines to which source of said nonvolatile semiconductor memory transistors are coupled is provided with a ramp rate for gradually raising the potential applied to said sources from a low voltage to a high voltage in accordance with said ramp rate, wherein the high voltage with the ramp rate to be supplied to said source lines is formed on the basis of a control voltage which rises gradually in such a way that charges are transferred between at least two capacitors having a comparatively great capacitance ratio, through a switch element that is switch-controlled by a cyclic pulse signal.

2. A nonvolatile semiconductor memory device formed on a semiconductor substrate, comprising:

a plurality of memory cells arranged in rows and columns, each of which memory cells is coupled to a word line, a common line, and a data line, wherein each of said plurality of memory cells consists essentially of one transistor consisting essentially of a first region coupled to the data line to which the memory cell is coupled, a second region coupled to the common line to which the memory cell is coupled, a control gate coupled to the word line to which the memory cell is coupled, and a floating gate;

indication means for generating an indication signal indicating a desired number of rows of said memory cells, wherein the desired number can be set between a minimum of two rows and a maximum of all of the rows of the memory cells; and erasure control means, coupled to said plurality of memory cells and to said indication means, responsive to said indication signal for selecting the desired number of rows indicated by the indication means as an area to be erased at one time in an erasure operation mode, and for performing an erasure operation to said area, in accordance with said indication signal, wherein a predetermined voltage difference to be supplied between the word line and the common line of memory cells within said area in the erasure operation is larger than a voltage difference between the word line and the common line of memory cells which are not in the area selected to be erased in the erasure operation mode.

3. A nonvolatile semiconductor memory device according to claim 2, wherein the indication means indicates the desired number of rows of said memory cells which are continuously arranged with respect to one another.

4. A nonvolatile semiconductor memory device according to claim 3, wherein each of said rows of memory cells includes a word line and a plurality of memory cells.

5. A nonvolatile semiconductor memory device according to claim 4, wherein said indication means includes an address buffer which receives data via address terminals and outputs data as said indication signal.

6. A nonvolatile semiconductor memory device according to claim 2, wherein each of said rows of memory cells includes a word line and a plurality of memory cells.

7. A nonvolatile semiconductor memory device according to claim 6, wherein said indication means includes an address buffer which receives data via address terminals and outputs data as said indication signal.

* * * * *